(12) United States Patent
Fastow et al.

(10) Patent No.: US 6,400,608 B1
(45) Date of Patent: Jun. 4, 2002

(54) ACCURATE VERIFY APPARATUS AND METHOD FOR NOR FLASH MEMORY CELLS IN THE PRESENCE OF HIGH COLUMN LEAKAGE

(75) Inventors: Richard Fastow, Cupertino; Sameer S. Haddad, San Jose; Lee E. Cleveland, Santa Clara, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/842,288

(22) Filed: Apr. 25, 2001

(51) Int. Cl.[7] .............................................. G11C 11/34
(52) U.S. Cl. ................... 365/185.22; 365/185.2
(58) Field of Search ......................... 365/185.22, 185.2

(56) References Cited

U.S. PATENT DOCUMENTS

| | | | |
|---|---|---|---|
| 5,335,198 A | 8/1994 | Van Buskirk et al. ....... 365/185 |
| 5,521,864 A | * 5/1996 | Kobayashi et al. .... 365/185.22 |
| 5,642,311 A | 6/1997 | Cleveland et al. ........ 365/185.3 |
| 5,856,945 A | 1/1999 | Lee et al. ................. 365/185.3 |
| 6,046,932 A | 4/2000 | Bill et al. ............... 365/185.02 |
| 6,172,909 B1 | 1/2001 | Haddad et al. ......... 365/185.19 |
| 6,181,599 B1 | 1/2001 | Gongwer ................ 365/185.18 |
| 6,198,664 B1 | 3/2001 | Fastow ................... 365/185.29 |
| 6,205,059 B1 | 3/2001 | Gutala et al. ........... 365/185.33 |
| 6,243,292 B1 | * 6/2001 | Kobayashi et al. .... 365/185.13 |

FOREIGN PATENT DOCUMENTS

| JP | 0065176 | * 3/1990 | ......... H01L/29/788 |
|---|---|---|---|
| JP | 0090684 | * 3/1990 | ......... H01L/29/788 |

OTHER PUBLICATIONS

Betty Prince, "Semiconductor Momories", 1983, Wiley, 2nd edition, pp. 586–587.*

* cited by examiner

Primary Examiner—M. Tran
(74) Attorney, Agent, or Firm—Renner, Otto, Boisselle & Sklar

(57) ABSTRACT

A technique is provided for reducing column leakage in a flash EEPROM device during an erase verification process, thereby preventing false verifies. The technique has application in NOR arrays or other types of arrays in which a number of cells are connected in parallel. The technique operates by reducing the leakage of the unselected cells in parallel to the selected cell being verified, thereby preventing false verifies. The technique can also be used in conjunction with other techniques for reducing column leakage, such as soft programming, automatic programming disturb erase (APDE), or various other $V_{th}$ compacting schemes.

20 Claims, 5 Drawing Sheets

ACCURATE VERIFY APPARATUS AND METHOD FOR NOR FLASH MEMORY CELLS IN THE PRESENCE OF HIGH COLUMN LEAKAGE

TECHNICAL FIELD

The present invention relates to an integrated circuit memory including an array of flash EEPROM cells, and more particularly to circuitry for providing accurate verification in the presence of high column leakage.

BACKGROUND OF THE INVENTION

A microelectronic flash or block erase Electrically Erasable Programmable Read-Only Memory (Flash EEPROM) includes an array of cells which can be independently programmed and read. The size of each cell and thereby the memory are made small by omitting select transistors which would enable the cells to be erased independently. All of the cells are erased together as a block.

A memory of this type includes individual Metal-Oxide-Semiconductor (MOS) field effect transistor memory cells, each of which includes a source, drain, floating gate and control gate to which various voltages are applied to program the cell with a binary 1 or 0, or erase all of the cells as a block. The cells are connected in a rectangular array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying, typically, 9 volts (V) to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying, typically, 5 V to the control gate, 1 V to the bitline to which the drain is connected, grounding the source, and sensing the bitline current. If the cell is programmed and the threshold voltage is relatively high (e.g., 4 V), the bitline current will be zero or at least relatively low. If the cell s not programmed or erased, the threshold voltage will be relatively low (e.g., 2 V), the control gate voltage will enhance the channel, and the bitline current will e relatively high.

A cell can be erased in several ways. In one arrangement, a cell is erased by applying, typically, 12 V to the source, grounding the control gate and allowing he drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of –10 V to the control gate, applying 5 V to the source and allowing the drain to float. Alternatively, a cell can be erased by applying a negative voltage on the order of –10 V to the control gate, and a positive voltage of the order of +10 V to the p-well.

A problem with conventional flash EEPROM cell arrangements is that due to manufacturing tolerances, some cells become overerased before other cells become erased sufficiently. Thus, after each erase procedure an erase verification process or procedure (erase verify) is conducted. Specifically, erase verify is performed cell by cell to determine if each cell in the array has a threshold above a limit (e.g., 3 V), or if the cell is "undererased". If an undererased cell is detected, an additional erase pulse is applied to the entire array. With such an erase procedure, a cell which is not undererased will also be repeatedly erased, and its floating gate may eventually acquire a threshold below zero volts. A cell with a threshold erased below zero volts is referred to as being "overerased".

Overerased cells are undesirable because they create bitline leakage current during program or read procedures which can render the memory inoperative. The floating gates of the overerased cells are depleted of electrons and become positively charged. This causes the overerased cells to function as depletion mode transistors which cannot be turned off by normal operating voltages applied to their control gates, and introduces leakage during subsequent program and read operations.

On the other hand, undererased cells are also undesirable as undererased cells lead to faulty storage of data, for example. An undererased cell may be read as having a programmed binary value 1, for example, when in fact the cell is intended to have a programmed binary value 0. Thus, it is important that the erase verification procedure accurately detect the presence of an adequately erased cell. It is important that the erase verification procedure avoid a "false verify" where an undererased cell is falsely identified as fully erased.

A problem in the past has been the bit line leakage current of overerased cells can lead to a false verify of an undererased cell during the erase verification process. More specifically, during an erase verify only one wordline which is connected to the control gates of a row of cells including the selected cell under test is held high at a time. The other wordlines are grounded. A positive voltage is applied to the drain of all of the cells in the column including the selected cell. If the threshold voltage of an unselected cell or cells in the column is zero or negative, leakage current will flow through the source, channel and drain of the unselected cell or cells and possibly result in a false verify.

This undesirable effect is illustrated in FIG. 1. The drains of a column of floating gate cell transistors $T_0$ to $T_m$ are connected to a bitline BL, which is itself connected to a bitline driver 1. The sources of the transistors $T_0$ to $T_m$ are typically connected to ground. One of the transistors $T_0$ to $T_m$ is selected at a time for an erase verification procedure, and a positive voltage, e.g. 5 V, is applied to its control gate which turns on the transistor. The control gates of the unselected transistors in the column are connected to ground.

As viewed in FIG. 1, 5 V is applied to the transistor $T_1$ which turns it on. A current $I_1$ flows through the transistor $T_1$ from ground through its source, channel (not shown) and drain and through the bitline BL to the driver 1. Ideally, the bitline current $I_{BL}$ should be equal to $I_1$, and is sensed by a sense amplifier (not shown). The sense amplifier compares the bitline current $I_{BL}$ to the current $I_{ref}$ (verify current) in a reference cell (also not shown) indicative of a sufficiently erased cell. Provided the transistor $T_1$ is sufficiently erased, the bitline current $I_{BL}$ (or $I_1$) is equal to the current $I_{ref}$ in the reference cell as determined by the sense amplifier. If the transistor $T_1$ is not sufficiently erased, the bitline current $I_{BL}$ (or $I_1$) is less than the current $I_{ref}$ as determined by the sense amplifier. Thus, it is possible to verify if the transistor $T_1$ is sufficiently erased based on the output of the sense amplifier.

However, if one or more of the unselected transistors, e.g. the transistor $T_2$ as illustrated in FIG. 1, is overerased, its threshold voltage will be zero or negative, and background leakage current will flow through the transistor $T_2$ as indicated at $I_2$. The bitline current $I_{BL}$ during the erase verification of transistor $T_1$ is now no longer equal to $I_1$, but is equal to the sum of $I_1$ and the background leakage current $I_2$.

In a typical flash EEPROM, the drains of a large number, for example 512, transistor cells such as illustrated in FIG. 1 are connected to each bitline (column). If a substantial number of cells on the bitline are drawing background leakage current, the total leakage current on the bitline in combination with the current from the selected cell can equal or exceed the reference cell current $I_{ref}$ during the erase verification process. This can result in a false verify condition where the selected cell itself is undererased yet is verified as being erased due to the contribution of the leakage current on the bitline.

In view of the aforementioned shortcomings associated with conventional flash EEPROM devices, there is a strong need in the art for an apparatus and method for providing accurate erase verification even in the presence of high column leakage. Moreover, there is a strong need in the art for an apparatus and method for performing other types of verification without false verifies even in the presence high column leakage.

Summary of the Invention

The present invention provides a technique for reducing column leakage in a flash EEPROM device during a verification process, thereby preventing false verifies. The invention has application in NOR arrays or other types of arrays in which a number of cells are connected in parallel. The invention operates by reducing the leakage of the unselected cells in parallel to the selected cell or cells being verified, thereby preventing false verifies. The invention can also be used in conjunction with other techniques for reducing column leakage, such as soft programming, automatic programming disturb erase (APDE), or various other $V_{th}$ compacting schemes.

During a verify process in accordance with the present invention, the current of a selected cell or cells in the array is compared to a verify reference cell current $I_{ref}$. Leakage current from the unselected cells is reduced by applying a negative bias (e.g., <0 V to −5 V) to the p-well in which the array of cells is located. The body effect of the cells will result in an increased threshold voltage ($V_{th}$) for each of the cells, thereby reducing the leakage current. By applying the same negative bias to the p-well of the reference cell, the currents of the selected cell or cells and the reference cell can be accurately compared without the accompanying leakage current from the unselected cells. In turn, this avoids false verifies during the verification process.

In accordance with one aspect of the invention, a flash memory device is provided. The flash memory device includes an array of flash memory cells formed in a p-well in a semiconductor substrate and operatively arranged in rows and columns, wherein the cells in a same row each have a control gate connected to a same corresponding wordline, the cells in a same column each have a drain connected to a same corresponding bitline, and each of the cells has a source connected to a source potential. In addition, the flash memory device includes a control circuit for verifying whether the cells have been erased. The control circuit is configured to perform the steps of: i) selecting at least one cell from among the cells in a same column by applying a high voltage to the bitline corresponding to the same column and to the wordline or wordlines correspondingly connected to the at least one cell to be selected and by applying a low voltage to the remaining wordlines correspondingly connected to the non-selected cells in the same column; ii) applying a negative voltage bias selectively to the p-well during the verify operation; iii) comparing a current through the bitline of the selected at least one cell with a current of a reference cell; and iv) verifying whether the selected at least one cell is operating properly based on the comparison.

In accordance with another aspect of the invention, a method is provided for verifying operation in a flash memory device having an array of flash memory cells formed in a p-well in a semiconductor substrate and operatively arranged in rows and columns, wherein the cells in a same row each have a control gate connected to a same corresponding wordline, the cells in a same column each have a drain connected to a same corresponding bitline, and each of the cells has a source connected to a source potential. The method includes the steps of: i) selecting at least one cell from among the cells in a same column by applying a high voltage to the bitline corresponding to the same column and to the wordline or wordlines correspondingly connected to the at least one cell to be selected and by applying a low voltage to the remaining wordlines correspondingly connected to the non-selected cells in the same column; ii) applying a negative voltage bias selectively to the p-well during the verify operation; iii) comparing a current through the bitline of the at least one selected cell with a current of a reference cell; and iv) verifying whether the selected at least one cell is operating properly based on the comparison.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF THE PREFERRED EMBODIMENT

Figure 1:
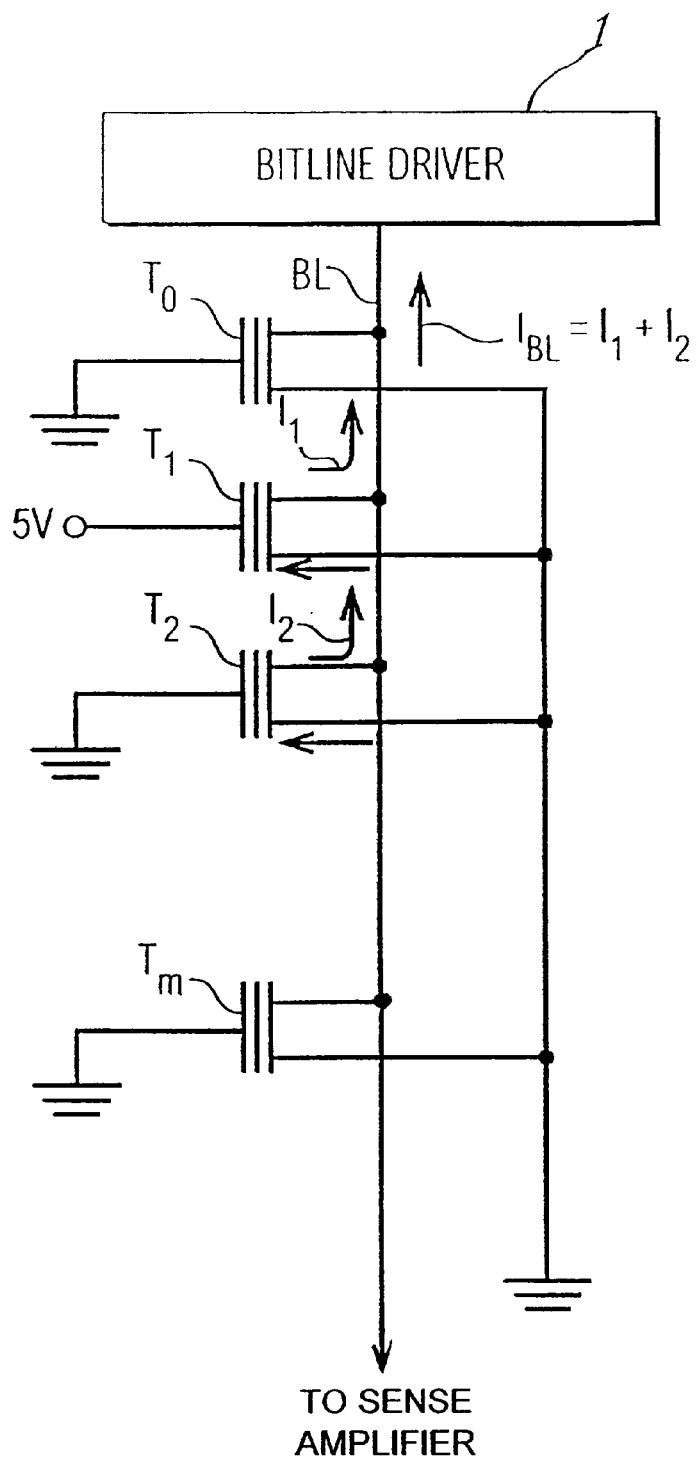
FIG. 1 is a simplified electrical schematic diagram showing how leakage current is generated in a prior art flash EEPROM device.

The present invention will now be described with reference to the drawings, in which like reference numerals are used to refer to like elements throughout.

Figure 2:
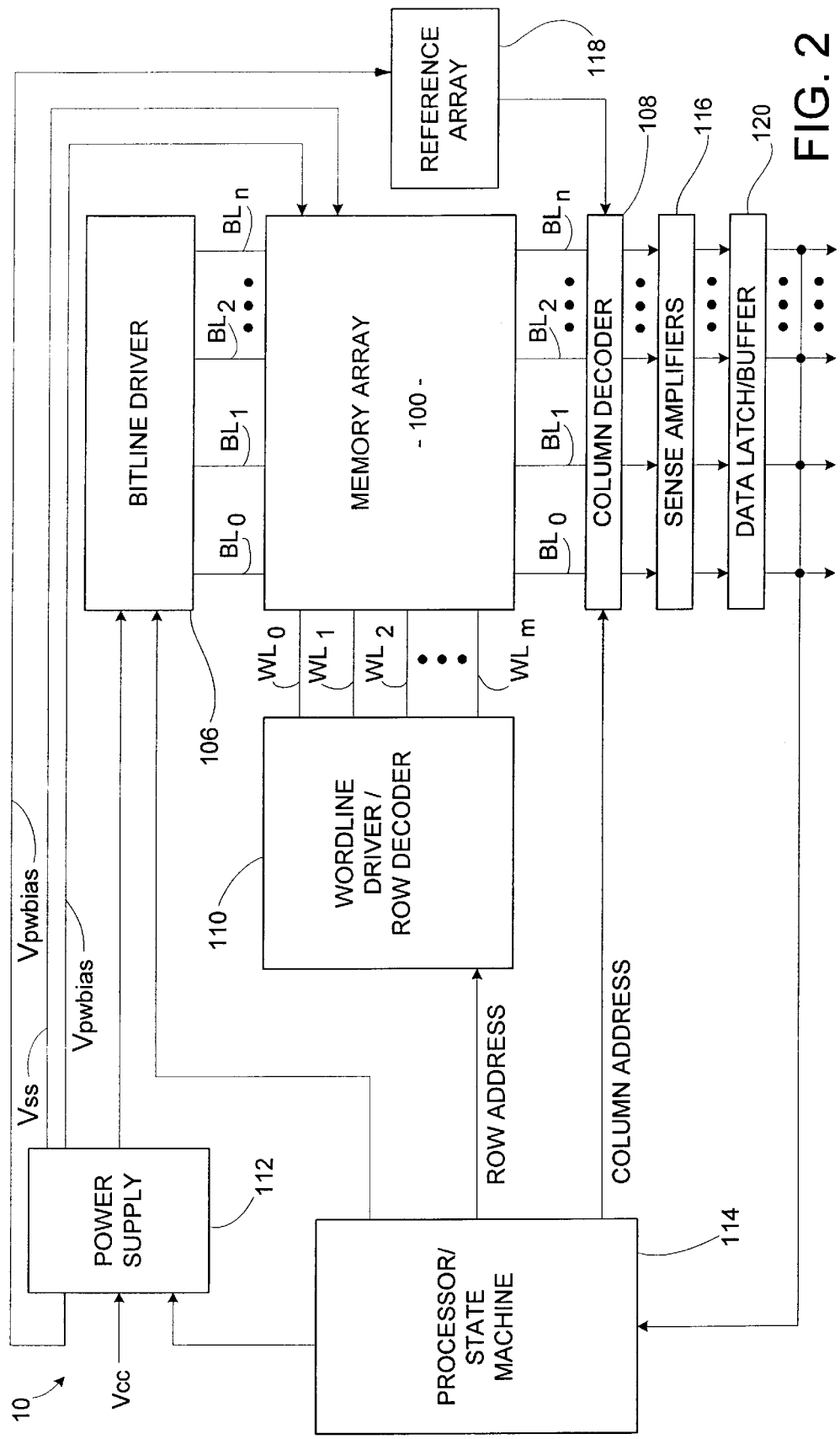
FIG. 2 is a block diagram of a flash EEPROM device in accordance with the present invention.

Referring initially to FIG. 2, a flash EEPROM device 10 is shown in accordance with the present invention. The EEPROM device 10 is an integrated circuit which includes a flash EEPROM memory array 100 and circuitry enabling programming, erasing, reading, overerase correction, etc. for memory cells in the array 100. The flash EEPROM array 100 is composed of individual cells as illustrated in more detail in FIG. 3.

Figure 3:
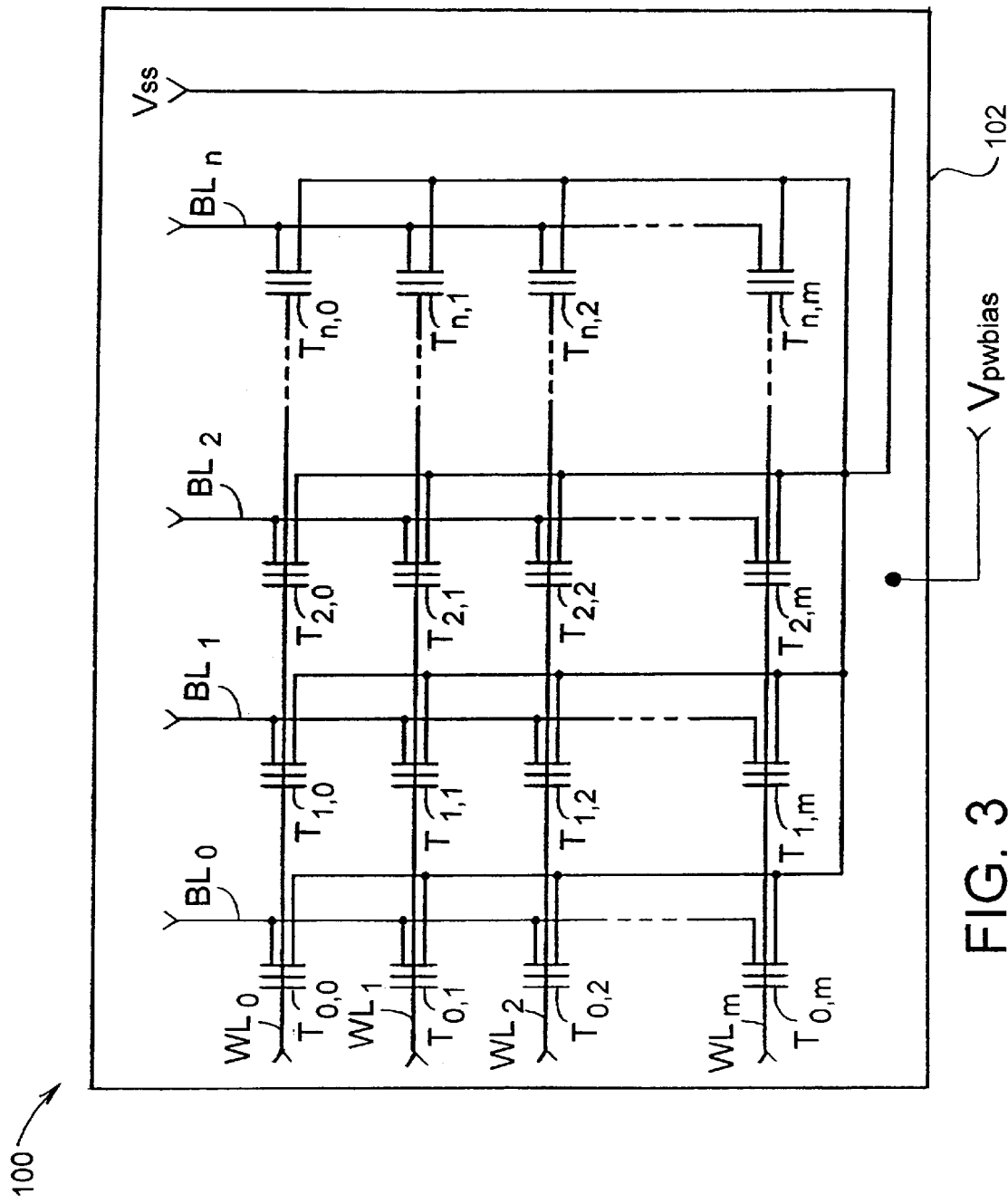
FIG. 3 is a schematic diagram of the array of memory cells in the flash EEPROM device of FIG. 2 in accordance with the present invention.

As is shown in FIG. 3, the array 100 includes floating gate transistor cells T arranged in an array of m+1 rows and n+1 columns. Each particular cell $T_{i,j}$ (where i=0 to m; and j=0 to n) in a given column has a drain connected to a bitline $BL_j$ (where j=0 to n). The source of each of the array cells $T_{i,j}$ is connected to a source supply voltage Vss. The gate of each particular cell $T_{i,j}$ in a given row is connected to a wordline $WL_i$ (where i=0 to m).

With respect to the semiconductor substrate on which the flash EEPROM device 10 is formed, the array cells $T_{i,j}$ are formed in a p-well 102 as represented in FIG. 3. In accordance with the present invention, the p-well 102 receives a selectively controlled bias voltage $V_{pwbias}$ which serves to reduce the leakage current in a given column during a verification process or procedure. By selectively providing a negative bias voltage (e.g., $V_{pwbias}$=<0 V to –5 V) to the p-well 102, the body effect of the cells $T_{i,j}$ results in an increased threshold voltage $V_{th}$ of each of the cells. Consequently, reduced leakage current occurs among the non-selected and potentially overerased cells in the array 100 during an erase verification process, for example.

Further in accordance with the invention, a corresponding negative bias voltage is provided to the p-well in which the reference cell associated with the selected cell or cells is located. As a result, a comparison of the current on the bitline of the selected cell and the current of the reference cell results in an accurate verification (e.g., as to whether the selected cell has been adequately erased).

Again referring to FIG. 2, each bitline BL (e.g., $BL_o$, $BL_1$, ..., $BL_n$) connecting the drains of the cells in a given column is connected to a bitline pull up circuit 106 and to a column decoder 108 included in the device 10. The wordlines (e.g., $WL_o$, $WL_1$, ..., $WL_m$) each connecting the gates of the cells in a given row are connected to a row decoder 110.

The row decoder 110 receives voltage signals from a power supply 112 and distributes the particular voltage signals to the wordlines WL as controlled by a row address received from a processor or state machine 114. Likewise, the bitline pull up circuit 106 receives voltage signals from the power supply 112 and distributes the particular voltage signals to the bitlines BL as controlled by a signal from the processor 114. Voltages provided by the power supply 112 are provided as controlled by signals received from processor 114.

The column decoder 108 provides signals from particular bitlines BL to sense amplifiers or comparators 116 as controlled by a column address signal received from the processor 114. The sense amplifiers 116 further receive a signal from reference cells of a reference array 118. With signals from the column decoder 108 and reference array 118, the sense amplifiers 116 then each provide a signal indicating a state of a bitline BL relative to a reference cell line to which it is connected through data latches or buffers 120 to the processor 114.

To program a cell T in the flash memory array 100, high gate and drain voltage pulses are provided to the cell T from the power supply 112. The source of the cell and the p-well may be grounded or may also be set to a non-zero potential. The high gate and drain voltage pulses enable electrons flowing from the source to drain to overcome an energy barrier to produce "hot electrons" which are accelerated across a thin dielectric layer enabling the electrons to be driven onto a floating gate of the cell. This results in an increase of a threshold voltage $V_{th}$ for the cell, the threshold being the gate-to-source voltage required for the cell T to conduct.

In order to erase a cell in the flash memory array 100, Fowler-Nordheim tunneling is utilized wherein relatively high negative gate-to-pwell voltage pulses are applied for a few milliseconds each, for example. The large negative gate-top-pwell voltage pulses enable electrons to tunnel from the floating gate of a cell reducing its threshold.

Regarding reading a cell, a control gate voltage between the 3.0 and 6.5 volt range, typically 5 V, is applied. The 5 V read pulse is applied to the gate of an array cell as well as a cell in reference array 118 having a threshold near 3 V. In a programmed state with an array cell in array 100 having a threshold above 5 V, current provided by the reference cell with a threshold of 3 V will be greater indicating a programmed cell exists. In an erased state with a threshold of a cell in array 100 below 3 V, current provided by the array cell will be greater than the reference cell with a threshold of 3 V indicating an erased cell.

The details for programming, erasing and reading the cells T are known in the art, and thus are not germane to the present invention. Accordingly, further detail has been omitted for sake of brevity. (See, e.g., U.S. Pat. No. 5,642,311 entitled "Overerase Correction for Flash Memory Which Limits Overerase and Prevents Erase Verify Errors", the entire disclosure of which is incorporated herein by reference).

To verify programming, soft programming or erase, for example, a read voltage is applied to both a cell in the array and to cells in the reference array 118. For programming, a reference cell having a threshold of 4.5 V is used for a comparison, while for erase, a reference cell having a threshold of 2.5 V is used for comparison, for example.

The verification procedure of the present invention will now be described in more detail in connection with an erase verification procedure. It will be appreciated, however, that the invention has application in a variety of other types of verification (e.g., programming, soft-programming, APDE, etc.) where it is desirable to reduce the effects of high column leakage.

In the exemplary flash EEPROM 10, all cells T are erased simultaneously. Erasing of the memory cells T is done by repeated applications of the short erase pulses, described above, applied to each of the cells in the array 100. After each erase pulse, an erase verify is performed cell by cell to determine if each cell in the array has a threshold below a limit, such as 2.5 V, or if a cell is undererased. If an undererased cell is detected, an additional erase pulse is applied to the entire array.

Figure 4:
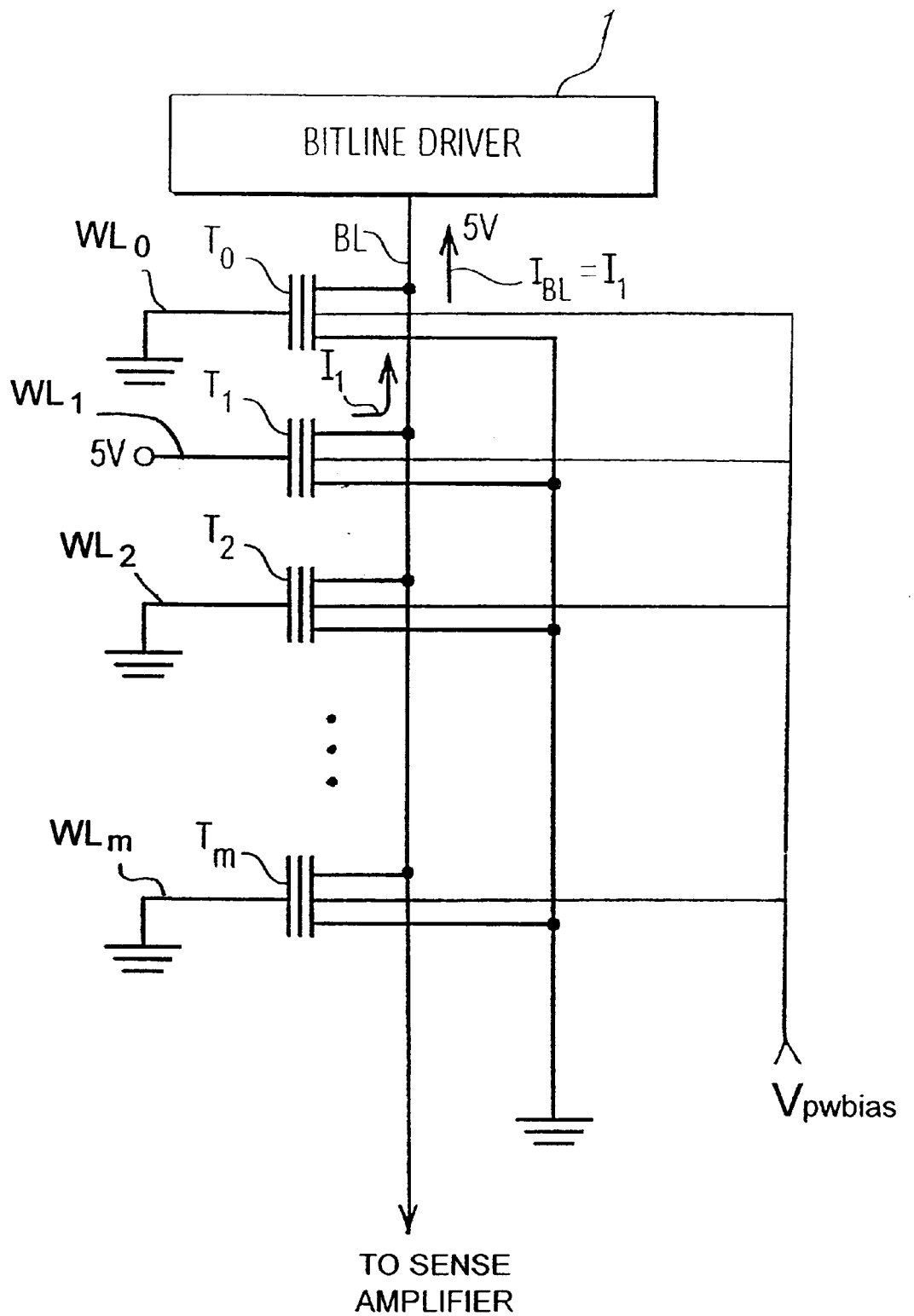
FIG. 4 is a simplified electrical schematic diagram showing how leakage current is reduced in a flash EEPROM device in accordance with the present invention.

Referring to FIG. 4, the erase verification procedure for a given selected cell (e.g., $T^1$) occurs as follows. As mentioned above, the erase verification is performed cell by cell by selecting one cell at a time. For example, the processor 114 selects cell $T_1$ by causing a high voltage (e.g., 5 V) to be applied to the particular bitline BL connected to the drain of $T_1$ and the particular wordline $WL_1$ connected to the gate of $T_1$. All the other bitlines BL and wordlines WL receive a low voltage (e.g., 0 V) such that the cells other than $T_1$, remain unselected. Additionally, the processor 114 during the erase verification procedure causes the power supply 112 to provide a negative bias voltage $V_{pwbias}$ to the p-well 102 (FIG.

3) in which the unselected cells reside that share the same bitline BL as the selected cell $T_1$. The negative bias voltage $V_{pwbias}$ may be, for example, a voltage in the range of 0 V to −5 V. Similarly, the processor 114 causes the power supply 112 to provide the same negative bias voltage $V_{pwbias}$ to the p-well of the reference array 118 in which the reference cell resides to which the selected cell current is to be compared.

As a result of the body effect caused by the negative bias voltage applied to the p-well 102, the threshold voltage $V_{th}$ of all the cells sharing the bitline of the selected cell $T_1$, will increase. Thus, any leakage current which may otherwise be present with conventional read condition voltages applied to p-well 102 (e.g., leakage current $I_2$ in FIG. 1) will be reduced and/or eliminated. Since the threshold voltage $V_{th}$ of each of the cells T has been increased during the erase verification procedure, less current leakage will occur due to any overerased cells. Accordingly, the current on the bitline BL will be substantially equal to the current $I_1$, due to the selected cell $T_1$. This reduces the possibility of a false verify condition as the non-selected cells with the increased threshold voltages $V_{th}$ will not contribute leakage current which leads to a false verify condition.

Since the voltage bias applied to the p-well 102 of the selected cell $T_1$ is also applied to the corresponding reference cell in the reference array 118, the threshold voltages of the selected cell $T_1$ and the reference cell will be affected equally. Thus, the sense amplifiers 116 simply compare the bitline current with the reference cell current in the same manner as in a read operation. Alternatively, different bias voltages could be applied to the p-wells of the selected cell and the reference cell as long as the threshold voltage $V_{th}$ of the reference cell is adjusted accordingly.

The above-described process is repeated for each of the cells in the array 100 as part of the erase verification procedure. After the erase verification procedure has been completed, the processor 114 causes the bias levels of the p-wells for the array 100 and the reference array 118 to return to their conventional bias levels (i.e., returns the bias levels to the read condition bias level).

The erase verification procedure of the present invention can be part of an otherwise conventional erase process. Alternatively, the erase verification procedure may be part of advanced erase and erase verification techniques such as APDE (described in the aforementioned U.S. Pat. No. 5,642,311). In this case, the APDE procedure may use the conventional verify method (i.e., p-well=0 V), or the new method proposed here (i.e., p-well <0 V). In addition, the invention may be combined with other techniques for reducing column leakage, such as soft programming, APDE, or various other $V_{th}$ compacting schemes. For example, the negative bias voltage $V_{pwbias}$ applied during erase verification reduces column leakage of the cells as described herein and has been found to reduce the number of APDE pulses (when used during APDE verify). Additionally, the present invention may be implemented along with the following technique which has been found to compact the $V_{th}$ distribution, eliminate soft programming overshoot, and functions in the presence of slow bits.

Figure 5:
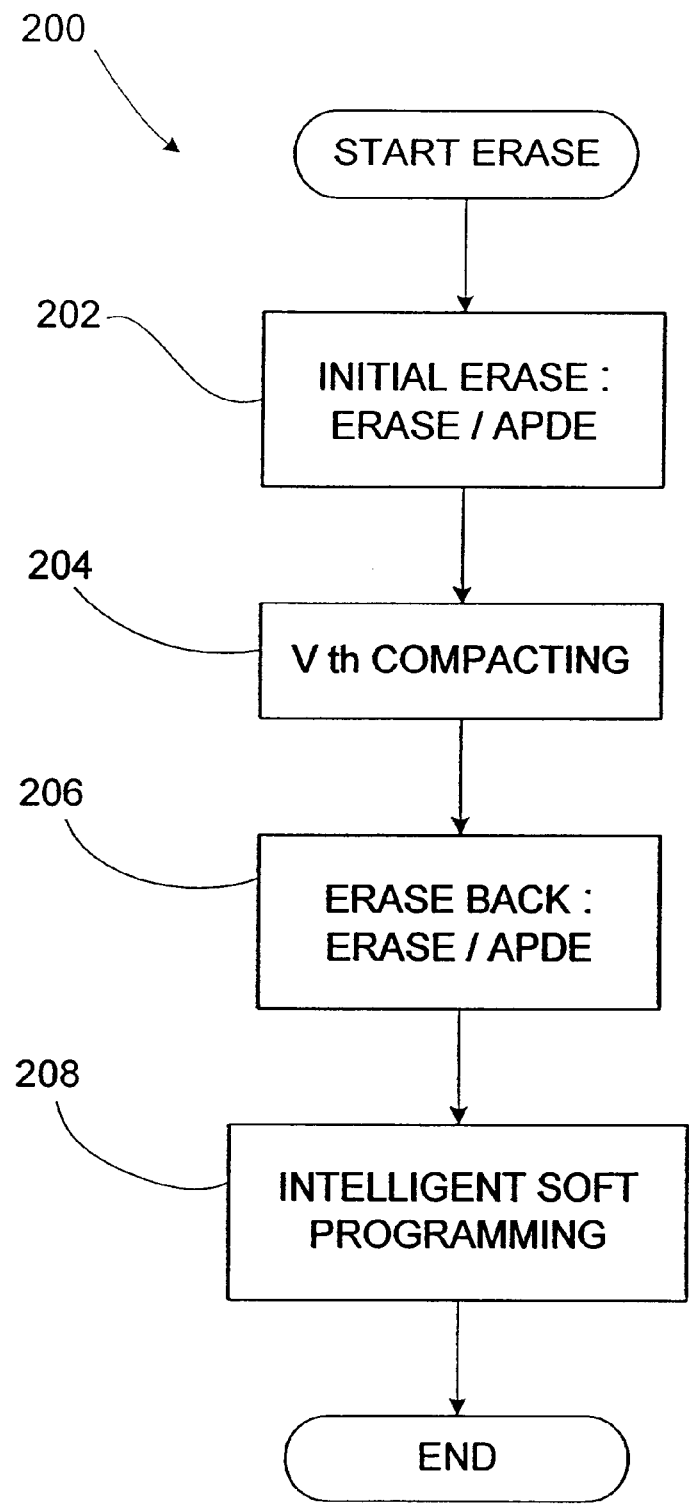
FIG. 5 is a flowchart illustrating an erase and overerase correction procedure incorporating the features of the present invention.

FIG. 5 summarizes an exemplary erase procedure 200 incorporating the aspects of the present invention. Beginning in step 202, an initial erase is performed using a conventional erase/APDE process. In step 202, the above described erase verification and APDE verification is performed using the negative bias voltage $V_{pwbias}$ applied to the p-well 102. Next, $V_{th}$ compacting is performed in step 204. For example, all bits below a predefined threshold receive a single soft programming pulse and again verification is performed using the negative bias applied to the p-well 102. Next, in step 206 an erase back with APDE is performed. In step 206, however, the erase back with APDE preferably is carried out without the negative bias applied to the p-well 102 due to the low column leakage after compacting, although negative p-well bias may also be used in this step. Finally, in step 208 intelligent soft programming with or without negative p-well bias during verify may be carried out if desired.

The present invention also has application in other types of verification processes (e.g., programming, soft-programming, APDE, etc.) where it is desirable to selectively reduce the presence of high column current leakage in order to eliminate false verifies. The present invention includes such applications within the intended scope. The respective cells in a given column may be selected one-by-one as in the above example, or in groups of two or more at a time. By applying a negative p-well bias voltage, the threshold voltage of the non-selected cells is increased such that leakage current is avoided during the verification process.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A flash memory device, comprising:
   an array of flash memory cells formed in a p-well in a semiconductor substrate and operatively arranged in rows and columns, wherein the cells in a same row each have a control gate connected to a same corresponding wordline, the cells in a same column each have a drain connected to a same corresponding bitline, and each of the cells has a source connected to a source potential; and
   control circuitry for verifying operation of the cells, the control circuitry performing the steps of:
   i) selecting at least one cell from among the cells in a same column by applying a high voltage to the bitline corresponding to the same column and to the wordline or wordlines correspondingly connected to the at least one cell to be selected and by applying a low voltage to the remaining wordlines correspondingly connected to the selected cells in the same column;
   ii) applying a negative voltage bias selectively to the p-well during the verify operation;
   iii) comparing a current through the bitline of the selected at least one cell with a current of a reference cell; and
   iv) verifying whether the selected at least one cell is operating properly based on the comparison.

2. The flash memory device of claim 1, wherein the application of the negative bias voltage functions to increase a threshold voltage of the cells connected to the same bitline as the selected at least one cell and reduce leakage current through the non-selected cells connected to the same bitline.

3. The flash memory device of claim 1, wherein the control circuitry applies a corresponding negative voltage bias to a p-well of the reference cell during the verifying operation.

4. The flash memory device of claim 3, wherein the negative voltage bias applied to the p-well of the memory cells is equal to the negative voltage bias applied to the p-well of the reference cell.

5. The flash memory device of claim 3, wherein the negative voltage bias applied to the p-well of the memory cells is different than the negative voltage bias applied to the p-well of the reference cell.

6. The flash memory device of claim 1, wherein the control circuitry repeats steps i–iv for each cell in the array of flash memory cells.

7. The flash memory device of claim 1, wherein the verifying operation is an erase verify.

8. The flash memory device of claim 1, wherein the verifying operation is a programming verify.

9. The flash memory device of claim 1, wherein the verifying operation is a soft-programming verify.

10. The flash memory device of claim 1, wherein the verifying operation is an ADPE verify.

11. A method for verifying operation in a flash memory device having an array of flash memory cells formed in a p-well in a semiconductor substrate and operatively arranged in rows and columns, wherein the cells in a same row each have a control gate connected to a same corresponding wordline, the cells in a same column each have a drain connected to a same corresponding bitline, and each of the cells has a source connected to a source potential, the method comprising the steps of:

i) selecting at least one cell from among the cells in a same column by applying a high voltage to the bitline corresponding to the same column and to the wordline or wordlines correspondingly connected to the at least one cell to be selected and by applying a low voltage to the remaining wordlines correspondingly connected to the non-selected cells in the same column;

ii) applying a negative voltage bias selectively to the p-well during verify operation;

iii) comparing a current through the bitline of the selected at least one cell with a current of a reference cell; and iv) verifying whether the selected at least one cell is operating properly based on the comparison.

12. The method of claim 11, wherein the application of the negative bias voltage functions to increase a threshold voltage of the non-selected cells connected to the same bitline as the selected at least one cell and reduce leakage current through the non-selected cells connected to the same bitline.

13. The method of claim 11 further comprising the step of applying a corresponding negative voltage bias to a p-well of the reference cell during the verifying operation.

14. The method of claim 13, wherein the negative voltage bias applied to the p-well of the memory cells is equal to the negative voltage bias applied to the p-well of the reference cell.

15. The method of claim 13, wherein the negative voltage bias applied to the p-well of the selected cell is different than the negative voltage bias applied to the p-well of the reference cell.

16. The method of claim 11, wherein steps i–iv are repeated for each cell in the array of flash memory cells.

17. The flash memory device of claim 11, wherein the verifying operation is an erase verify.

18. The flash memory device of claim 11, wherein the verifying operation is a programming verify.

19. The flash memory device of claim 11, wherein the verifying operation is a soft-programming verify.

20. The flash memory device of claim 11, wherein the verifying operation is a APDE verify.

* * * * *

UNITED STATES PATENT AND TRADEMARK OFFICE
CERTIFICATE OF CORRECTION

PATENT NO. : 6,400,608 B1
DATED : June 4, 2002
INVENTOR(S) : Fastow et al.

It is certified that error appears in the above-identified patent and that said Letters Patent is hereby corrected as shown below:

Column 1,
Line 46, replace "s" with -- is --
Line 49, replace "e" with -- be --
Line 52, replace "he" with -- the --

Column 6,
Line 12, replace "gate-top-pwell" with -- gate-to-pwell --

Signed and Sealed this

Thirtieth Day of July, 2002

Attest:

JAMES E. ROGAN
Attesting Officer    Director of the United States Patent and Trademark Office